(12) United States Patent
Funasaka et al.

(10) Patent No.: US 11,499,540 B2
(45) Date of Patent: Nov. 15, 2022

(54) DISPLACEMENT MAGNIFYING DEVICE, DIAPHRAGM TYPE COMPRESSOR, COOLING UNIT, PROJECTOR, RECORDING APPARATUS, AND THREE-DIMENSIONAL MOLDED OBJECT MANUFACTURING APPARATUS

(71) Applicant: Seiko Epson Corporation, Tokyo (JP)

(72) Inventors: Tsukasa Funasaka, Shiojiri (JP); Yuki Hanamura, Azumino (JP)

(73) Assignee: SEIKO EPSON CORPORATION

( * ) Notice: Subject to any disclaimer, the term of this patent is extended or adjusted under 35 U.S.C. 154(b) by 494 days.

(21) Appl. No.: 16/721,996

(22) Filed: Dec. 20, 2019

(65) Prior Publication Data
US 2020/0200163 A1 Jun. 25, 2020

(30) Foreign Application Priority Data
Dec. 21, 2018 (JP) .............................. JP2018-239695

(51) Int. Cl.
| | | |
|---|---|---|
| F04B 45/04 | (2006.01) | |
| B41J 29/377 | (2006.01) | |
| B33Y 30/00 | (2015.01) | |
| G03B 21/16 | (2006.01) | |
| H02N 2/12 | (2006.01) | |
| B29C 64/329 | (2017.01) | |
| H02N 2/04 | (2006.01) | |

(52) U.S. Cl.
CPC .............. *F04B 45/04* (2013.01); *H02N 2/12* (2013.01); *B29C 64/329* (2017.08); *B33Y 30/00* (2014.12); *B41J 29/377* (2013.01); *G03B 21/16* (2013.01); *H02N 2/04* (2013.01)

(58) Field of Classification Search
CPC .......... F04B 45/04–047; F04B 43/046; G03B 21/16; B33Y 30/00; H05K 7/20309; H05K 7/20318; H05K 7/20327; B41J 29/377
See application file for complete search history.

(56) References Cited

U.S. PATENT DOCUMENTS

| | | | | |
|---|---|---|---|---|
| 2011/0076170 A1* | 3/2011 | Fujisaki | ................ | F04B 45/047 417/415 |
| 2018/0163886 A1 | 6/2018 | Shirey et al. | | |

FOREIGN PATENT DOCUMENTS

| | | |
|---|---|---|
| JP | S49-052103 U | 5/1974 |
| JP | 2015-023588 A | 2/2015 |
| JP | 2018-526586 A | 9/2018 |

* cited by examiner

*Primary Examiner* — Mary Lynn F Theisen
(74) *Attorney, Agent, or Firm* — Harness, Dickey & Pierce, P.L.C.

(57) ABSTRACT

A displacement magnifying device includes a diaphragm structure including a substrate and a diaphragm provided separately from the substrate, actuators provided side by side with the diaphragm structure, and a first member including displacing sections coupled to both ends of the actuators and displaced according to displacement of the actuators. The displacing sections are coupled to the diaphragm of the diaphragm structure.

9 Claims, 17 Drawing Sheets

DISPLACEMENT MAGNIFYING DEVICE, DIAPHRAGM TYPE COMPRESSOR, COOLING UNIT, PROJECTOR, RECORDING APPARATUS, AND THREE-DIMENSIONAL MOLDED OBJECT MANUFACTURING APPARATUS

The present application is based on, and claims priority from, JP Application Serial Number 2018-239695, filed Dec. 21, 2018, the disclosure of which is hereby incorporated by reference herein in its entirety.

BACKGROUND

1. Technical Field

The present disclosure relates to a displacement magnifying device, a diaphragm type compressor, a cooling unit, a projector, a recording apparatus, and a three-dimensional molded object manufacturing apparatus.

2. Related Art

Various displacement magnifying devices have been used. Among such displacement magnifying devices, there is a displacement magnifying device including a diaphragm structure and an actuator. For example, JP A-2015-23588 (Patent Literature 1) discloses a displacement magnifying device in which two piezoelectric actuators are provided on the outside of a diaphragm structure. In the displacement magnifying device disclosed in Patent Literature 1, one piezoelectric actuator is coupled to the diaphragm structure and the two piezoelectric actuators are coupled. The diaphragm structure can be displaced by a displacement amount of the two piezoelectric actuators.

However, in the displacement magnifying device disclosed in Patent Literature 1, although the displacement amount is large, a reduction in size is difficult because the diaphragm structure and the two piezoelectric actuators provided in the displacement magnifying device are provided side by side in series in a displacing direction of the piezoelectric actuators. Since a displacement magnifying device small in size and having a large displacement amount is applied in a wide range, there is a demand for such a displacement magnifying device.

SUMMARY

A displacement magnifying device according to an aspect of the present disclosure includes: a diaphragm structure including a substrate and a diaphragm provided separately from the substrate; an actuator provided side by side with the diaphragm structure; and a first member including a displacing section coupled to both ends of the actuator and displaced according to displacement of the actuator. The displacing section is coupled to the diaphragm of the diaphragm structure.

DESCRIPTION OF EXEMPLARY EMBODIMENTS

Figure 1:
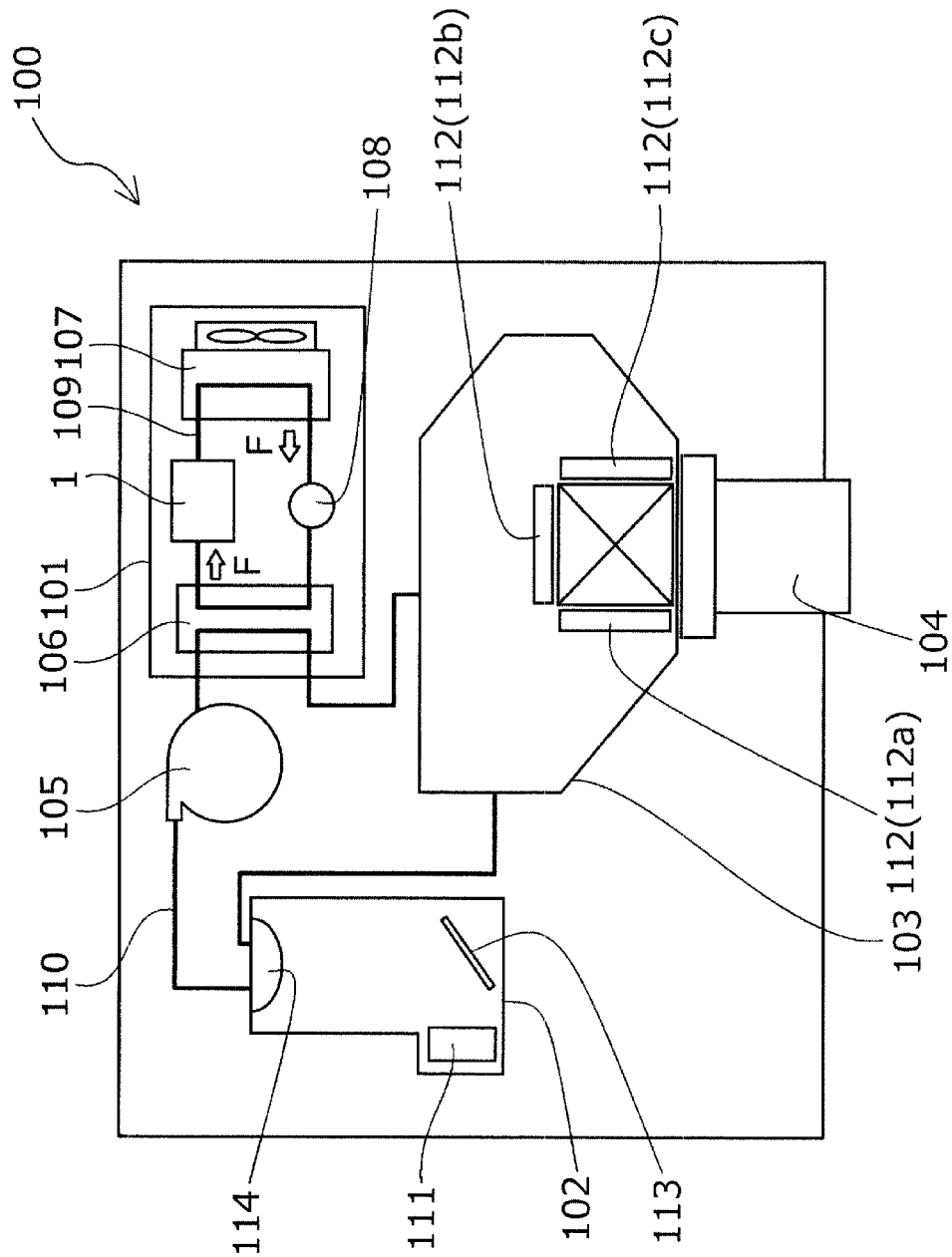
FIG. 1 is a schematic diagram showing an example of use in a projector of a diaphragm type compressor according to a first embodiment of the present disclosure.

First, the present disclosure is briefly explained.

A displacement magnifying device according to a first aspect of the present disclosure includes: a diaphragm structure including a substrate and a diaphragm provided separately from the substrate; an actuator provided side by side with the diaphragm structure; and a first member including a displacing section coupled to both ends of the actuator and displaced according to displacement of the actuator. The displacing section is coupled to the diaphragm of the diaphragm structure.

According to this aspect, the displacement magnifying device includes the first member in which the displacing section coupled to both the ends of the actuator and displaced according to displacement of the actuator is coupled to the diaphragm structure. Therefore, it is possible to set movement of the displacing section involved in the displacement of the actuator large and greatly displace the diaphragm. It is possible to reduce the displacement magnifying device in size because the actuator is provided in parallel to the diaphragm structure.

In a second aspect of the present disclosure, in the displacement magnifying device according to the first aspect, a displacing direction of the actuator crosses a displacing direction of the diaphragm.

According to this aspect, the displacing direction of the actuator crosses the displacing direction of the diaphragm. By adopting such a configuration, it is possible to execute mechanical resonance of the actuator and the first member for alternately performing the displacement of the actuator and the displacement of the first member. It is possible to set the displacement amount of the diaphragm particularly large.

In a third aspect of the present disclosure, in the displacement magnifying device according to the first or second aspect, the first member includes a first displacing section and a second displacing section as the displacing section, and, in a displacing direction of the diaphragm, the first displacing section and the second displacing section sandwich and couple the diaphragm structure.

According to this aspect, since the first displacing section and the second displacing section sandwich and couple the diaphragm structure, it is possible to set the displacement amount of the diaphragm particularly large.

In a fourth aspect of the present disclosure, in the displacement magnifying device according to any one of the first to third aspects, a plurality of the actuators are provided, and the diaphragm structure is provided between the plurality of actuators.

According to this aspect, since the plurality of actuators are provided, it is possible to set the displacement amount of the diaphragm particularly large.

A diaphragm type compressor according to a fifth aspect of the present disclosure includes: the displacement magnifying device according to any one of the first to fourth aspects; an inflow path formed in the substrate and coupled to a compression chamber formed between the substrate and the diaphragm, fluid flowing in through the inflow path; and an outflow path coupled to the compression chamber, the fluid compressed by displacement of the displacing section involved in the displacement of the actuator flowing out from the compression chamber through the outflow path.

According to this aspect, since the diaphragm type compressor includes the displacement magnifying device small in size and having the large displacement amount, the diaphragm type compressor can be a diaphragm type compressor small in size and having high performance.

A cooling unit according to a sixth aspect of the present disclosure includes: the diaphragm type compressor according to the fifth aspect; a heat radiating section for the fluid; a heat exchanging section for the fluid; and an expanding section for the fluid.

According to this aspect, since the cooling unit includes the displacement magnifying device small in size and having the large displacement amount, the cooling unit can be a cooling unit small in size and having high performance.

A projector according to a seventh aspect of the present disclosure includes: a light source; a panel configured to absorb light; a heat exchange medium; and the cooling unit in the sixth aspect. The heat exchange medium is provided between at least one of the light source and the panel and the heat exchanging section.

According to this aspect, since the projector includes the displacement magnifying device small in size and having the large displacement amount, the projector can be a projector small in size and having high performance.

A recording apparatus according to an eighth aspect of the present disclosure includes: a recording head configured to eject ink; an electronic circuit board coupled to the recording head; a heat exchange medium; and the cooling unit according to the sixth aspect. The heat exchange medium is provided between at least one of the recording head and the electronic circuit board and the heat exchanging section.

According to this aspect, since the recording apparatus includes the displacement magnifying device small in size and having the large displacement amount, the recording apparatus can be a recording apparatus small in size and having high performance.

A three-dimensional molded object manufacturing apparatus according to a ninth aspect of the present disclosure includes: a hopper configured to store a material serving as a constituent material of a three-dimensional molded object; a melting section configured to melt the material; a supply path for supplying the material from the hopper to the melting section; a heat exchange medium; and the cooling unit according to the sixth aspect. The heat exchange medium is provided between the supply path and the heat exchanging section.

According to this aspect, since the three-dimensional molded object manufacturing apparatus includes the displacement magnifying device small in size and having the large displacement amount, the three-dimensional molded object manufacturing apparatus can be a three-dimensional molded object manufacturing apparatus small in size and having high performance.

A diaphragm type compressor according to an embodiment of the present disclosure is explained in detail below with reference to the accompanying drawings.

First Embodiment (FIGS. 1 to 12)

A diaphragm type compressor 1 according to a first embodiment of the present disclosure is explained.
Projector First, a projector 100, which is an example of an apparatus in which the diaphragm type compressor 1 according to the first embodiment of the present disclosure is used, is explained with reference to FIG. 1.

The projector 100 shown in FIG. 1 includes a light source unit 102 including a light source 114, a phosphor 111, and a dichroic mirror 113. The projector 100 includes an optical element unit 103 including a panel 112 including an optical element 112a for red light, an optical element 112b for green light, and an optical element 112c for blue light and a projection lens 104. The projector 100 includes a cooling unit 101 for cooling the light source unit 102 and the optical element unit 103. The panel 112 is an optical element that absorbs light irradiated from the light source 114.

The cooling unit 101 includes the diaphragm type compressor 1 in this embodiment explained in detail below, a heat exchanging section 107, an expanding section 108 for fluid, which is a coolant, and an evaporator 106 functioning as a heat radiating section. The cooling unit 101 is configured such that a primary coolant flows in a direction F in a primary coolant pipe 109. With such a configuration, the cooling unit 101 can cool the light source unit 102 and the optical element unit 103, which are objects to be cooled, that is, the light source 114 and the panel 112.

The primary coolant is compressed by the diaphragm type compressor 1 and rises in temperature. The primary coolant flowing into the diaphragm type compressor 1 is low-pressure gas. The primary coolant flowing out from the diaphragm type compressor 1 is high-pressure gas.

The primary coolant compressed by the diaphragm type compressor 1 is cooled to a predetermined temperature by the heat exchanging section 107. The primary coolant cooled by the heat exchanging section 107 is high-pressure liquid.

The primary coolant cooled by the heat exchanging section 107 is expanded by the expanding section 108 and decreases in temperature. The primary coolant expanded by the expanding section 108 is low-pressure liquid.

The evaporator 106 changes the primary coolant from liquid to gas on the inside of the evaporator 106 and absorbs heat of the inside of the evaporator 106. The light source unit 102, the optical element unit 103, and the cooling unit 101 are coupled by a secondary coolant pipe 110. Secondary coolant is circulated in the secondary coolant pipe 110 by a liquid feeding pump 105. That is, the secondary coolant serving as a heat exchange medium and the secondary coolant pipe 110 are provided between the light source 114/the panel 112 and the heat exchanging section 107. The primary coolant pipe 109 and the secondary coolant pipe 110 are disposed side by side on the inside of the evaporator 106 of the cooling unit 101. Since the evaporator 106 has such an internal configuration, the secondary coolant is cooled on the inside of the evaporator 106 reduced in temperature by changing the primary coolant from the liquid to the gas. The cooled secondary coolant circulates in the light source unit 102 and the optical element unit 103, whereby the light source unit 102 and the optical element unit 103 are cooled.

In this way, the heat exchanging section 107 is configured to be capable of receiving heat from the light source 114 and the panel 112. Since the heat exchanging section 107 is configured to be capable of receiving heat from at least one of the light source 114 and the panel 112 in this way, the projector 100 can be a projector small in size and having high performance.

Recording Apparatus

A recording apparatus 200, which is an example of the apparatus in which the diaphragm type compressor 1 according to the first embodiment of the present disclosure is used, is explained with reference to FIGS. 2 and 3. The cooling unit 101 used in the recording apparatus 200 has the same configuration as the configuration of the cooling unit 101 shown in FIG. 1. Therefore, detailed explanation of the cooling unit 101 is omitted.

Figure 2:
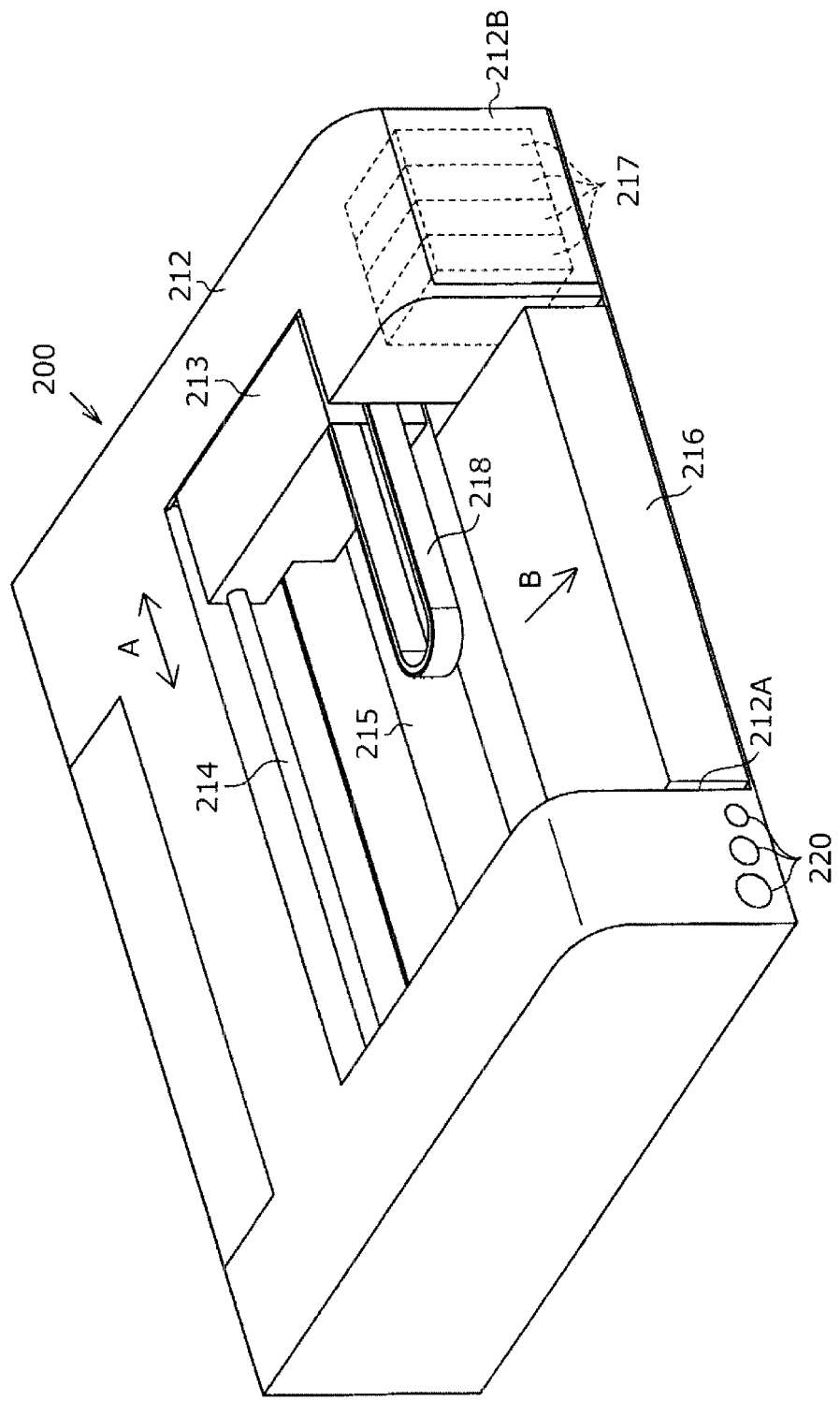
FIG. 2 is a schematic diagram showing an example of a recording apparatus in which the diaphragm type compressor according to the first embodiment can be used.

As shown in FIG. 2, the recording apparatus 200 includes a square box-like main body 212. In a center region of the main body 212, a carriage 213 is provided to be capable of reciprocating in a main scanning direction A in FIG. 2 while being guided by a guide spindle 214 suspended to extend along the main scanning direction A.

As shown in FIG. 2, in the center region of the main body 212, a platen 215 functioning as a long tabular medium supporting section is disposed in a lower position opposed to the carriage 213 in a state in which the longitudinal direction of the platen 215 is parallel to the main scanning direction A. In a lower part of the front surface of the recording apparatus 200, a cassette 216 for paper feeding is attached in a state in which the cassette 216 can be inserted into and removed from a concave attachment section 212A formed in the main body 212 to be opened on the front side. A plurality of ink cartridges 217 are loaded on the inner side of a cover 212B covering the right end front surface of the main body 212.

Inks in the ink cartridges 217 are respectively supplied to the carriage 213 through a not-shown plurality of ink supply tubes attached to a flexible wiring board 218. Ink droplets are discharged from a recording head 219 provided in a lower part of the carriage 213 as shown in FIG. 3. In the recording head 219, pressurizing elements (piezoelectric elements, electrostatic elements, heat generating elements, or the like) that apply, to the inks, pressure for discarding the inks are incorporated for each of nozzles. When a predetermined voltage is applied to the pressurizing elements, the ink droplets are discharged from the nozzles corresponding to the pressurizing elements.

During the recording, a recording medium is fed from the cassette 216. Ink droplets are discharged from the recording head 219 moving in the main scanning direction A together with the carriage 213 to the recording medium located on the platen 215, whereby recording for one line is applied to the recording medium. A recording operation by one scanning of the carriage 213 and a conveying operation for the recording medium in a conveying direction B to the next row are alternately repeated, whereby the recording on the recording medium is carried out. Various operation switches 220 including a power switch are provided in a left end front lower part of the main body 212. According to the recording, the recording head 219 and an electronic circuit board 211 that sends a driving signal to the recording head 219 rise in temperature. When the recording head 219 rises in temperature, it is likely that a nature of the ink in the ink supply path in the recording head 219 including the nozzles changes and discharge performance is deteriorated. When the electronic circuit board 211 rises in temperature, it is likely that the driving signal is erroneously sent.

Figure 3:
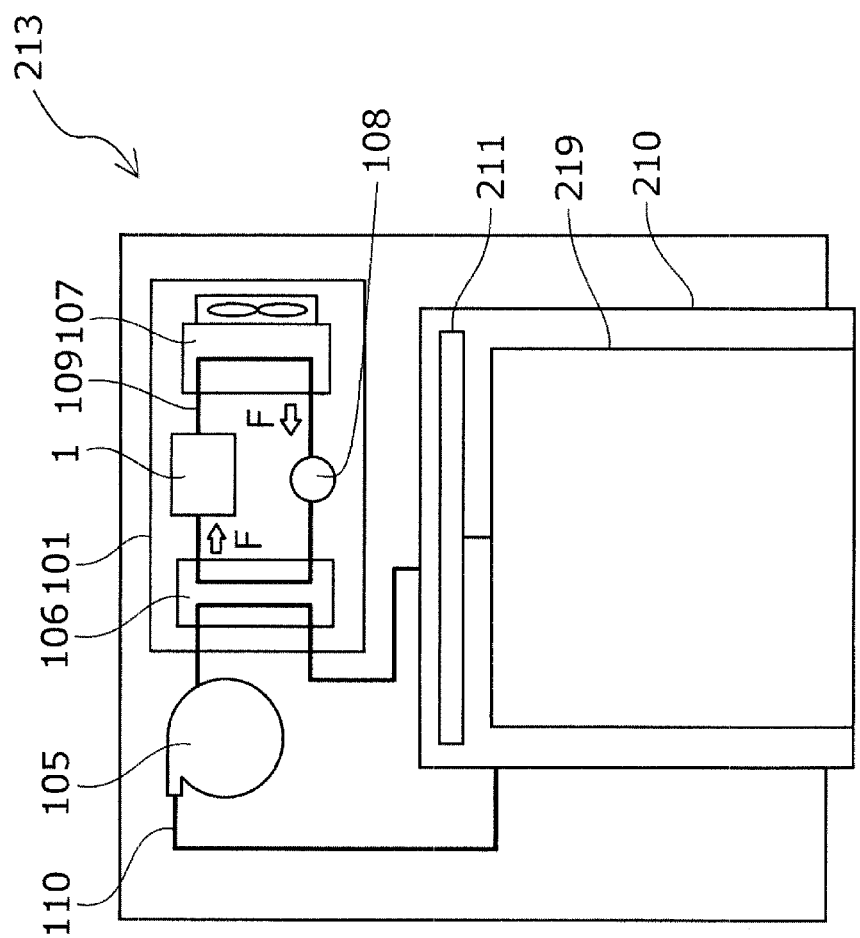
FIG. 3 is a schematic diagram showing an example of use in the recording apparatus of the diaphragm type compressor according to the first embodiment.

Therefore, as shown in FIG. 3, in the carriage 213, as in the projector 100 shown in FIG. 1, the cooling unit 101, the liquid feeding pump 105, and the secondary cooling pipe 110 are provided. The secondary coolant serving as the heat exchange medium and the secondary coolant pipe 110 are provided between the recording head 219/the electronic circuit board 211 and the heat exchanging section 107. A head unit 210 including the recording head 219 and the electronic circuit board 211 coupled to the recording head 219 is provided in the carriage 213. The heat exchanging section 107 of the cooling unit 101 is configured to be capable of receiving heat from the recording head 219 and the electronic circuit board 211. Since the heat exchanging section 107 is configured to be capable of receiving heat from at least one of the recording head 219 and the electronic circuit board 211 in this way, the recording apparatus 200 can be a recording apparatus small in size and having high performance.

Three-Dimensional Molded Object Manufacturing Apparatus

Figure 4:
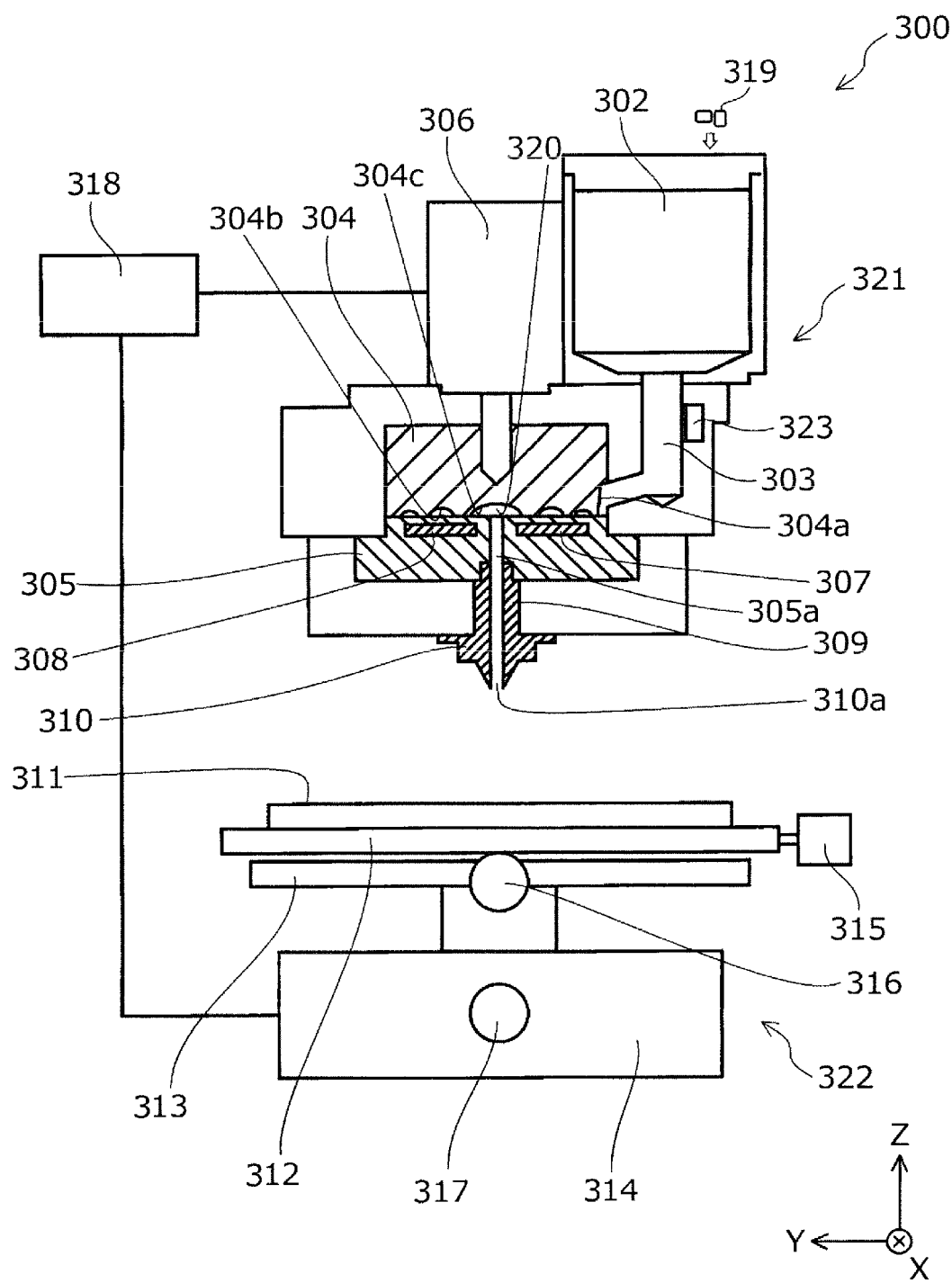
FIG. 4 is a schematic diagram showing an example of a three-dimensional molding device in which the diaphragm type compressor according to the first embodiment can be used.
Figure 5:
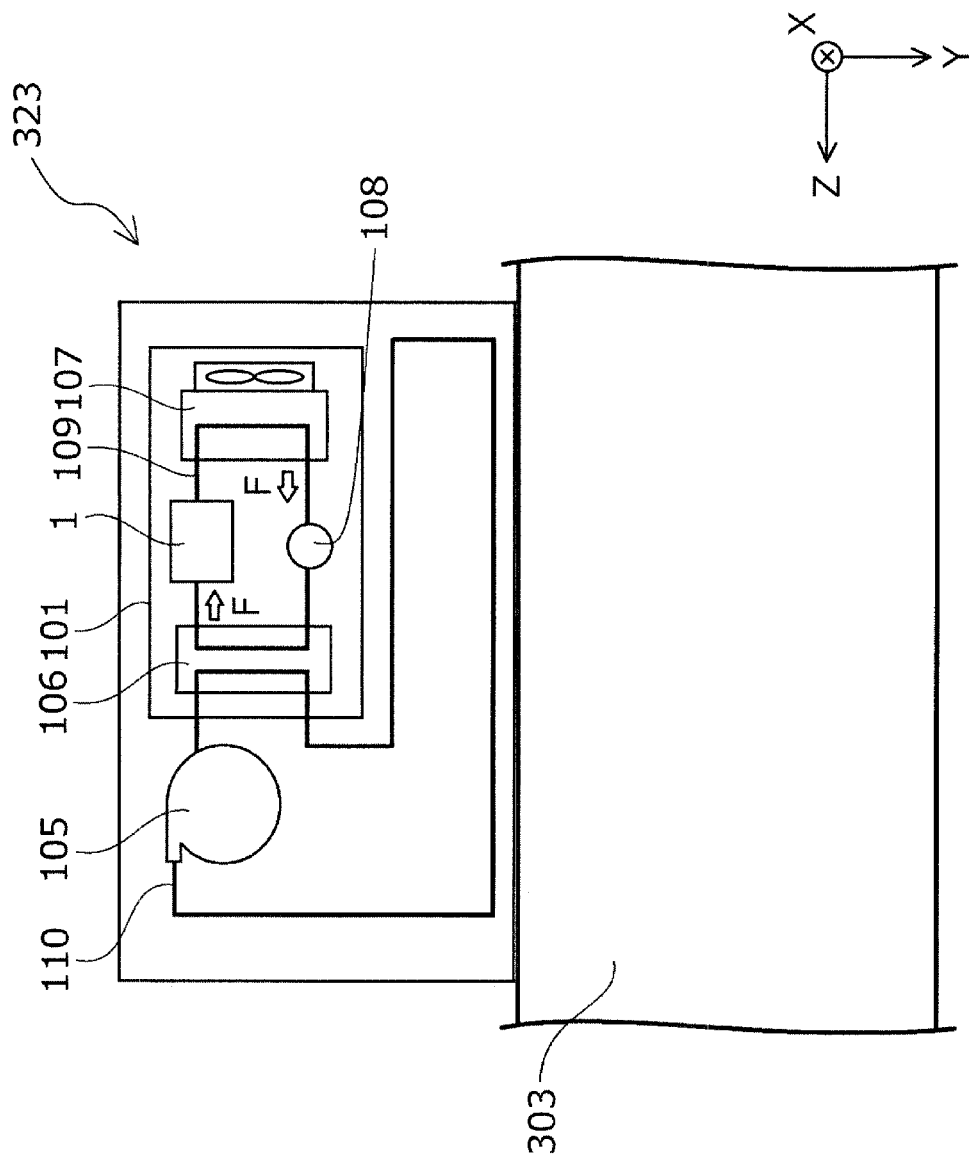
FIG. 5 is a schematic diagram showing an example of use in the three-dimensional molding device of the diaphragm type compressor according to the first embodiment.

A three-dimensional molded object manufacturing apparatus 300, which is an example of the apparatus in which the diaphragm type compressor 1 according to the first embodiment of the present disclosure is used, is explained with reference to FIGS. 4 and 5. The cooling unit 101 used in the recording apparatus 200 has the same configuration as the configuration of the cooling unit 101 shown in FIG. 1. Therefore, detailed explanation of the cooling unit 101 is omitted. In FIGS. 4 and 5, an X direction is the horizontal direction, a Y direction is the horizontal direction and is a direction orthogonal to the X direction, and a Z direction is the vertical direction.

"Three-dimensional molding" in this specification indicates forming a so-called solid molded object. Even if a shape is a so-called two-dimensional shape like a flat shape, for example, a shape formed by one layer, if the shape has thickness, forming the shape is also included in the "three-dimensional molding".

As shown in FIG. 4, the three-dimensional molded object manufacturing apparatus 300 includes a hopper 302 that stores pellets 319 serving as a constituent material (a material) forming a three-dimensional molded object. The pellets 319 stored in the hopper 302 are supplied to a circumferential surface 304a of a substantially columnar flat screw 304 via a supply path 303.

A spiral cutout 304b reaching from the circumferential surface 304a to a center portion 304c is formed on the bottom surface of the flat screw 304. Therefore, the flat screw 304 is rotated by a motor 306 around a rotation axis set in a direction along the Z direction, whereby the pellets 319 are sent from the circumferential surface 304a to the center portion 304c.

A barrel 305 is provided at a predetermined interval in a position opposed to the bottom surface of the flat screw 304. A heater 307 and a heater 308 are provided near the upper surface of the barrel 305. With such configurations of the flat screw 304 and the barrel 305, by rotating the flat screw 304, the pellets 319 are supplied to a space portion 320 formed by the cutout 304b formed between the bottom surface of the flat screw 304 and the upper surface of the barrel 305 and move from the circumferential surface 304a to the center portion 304c. When the pellets 319 move in the space portion 320 formed by the cutout 304b, the pellets 319 are melted, that is, plasticized by heat of the heater 307 and the heater 308 and pressurized by pressure involved in the movement in the narrow space portion 320. The pellets 319 are plasticized in this way, whereby a fluid constituent material is ejected from a nozzle 310a.

A moving path 305a for the constituent material, which is the melted pellets 319, is formed in the center portion of the barrel 305 in a plan view. The moving path 305a is connected to the nozzle 310a of an ejecting section 310 that ejects the constituent material.

The ejecting section 310 is configured to be capable of continuously ejecting the constituent material in a fluid state from the nozzle 310a. A heater 309 for setting the constituent material to desired viscosity is provided in the ejecting section 310. The constituent material ejected from the ejecting section 310 is ejected in a linear shape. The constituent material is ejected from the ejecting section 310 in the linear shape to form a layer of the constituent material.

In the three-dimensional molded object manufacturing apparatus 300 shown in FIG. 4, an ejecting unit 321 is formed by the hopper 302, the supply path 303, the flat screw 304, the barrel 305, the motor 306, and the ejecting section 310. The three-dimensional molded object manufacturing apparatus 300 in this embodiment includes one ejecting unit 321 that ejects the constituent material. However, the three-dimensional molded object manufacturing apparatus 300 may include a plurality of ejecting units 321 that eject the constituent material.

The three-dimensional molded object manufacturing apparatus 300 includes a stage unit 322 for placing the layer formed by ejecting the constituent material from the ejecting unit 321. The stage unit 322 includes a plate 311 on which the layer is actually placed. The stage unit 322 includes a first stage 312 on which the plate 311 is placed, the position of the first stage 312 being changeable along the Y direction by driving a first driving section 315. The stage unit 322 includes a second stage 313 on which the first stage 312 is placed, the position of second stage 313 being changeable along the X direction by driving a second driving section 316. The stage unit 322 includes abase section 314 capable of changing the position of the second stage 313 along the Z direction by driving a third driving section 317.

The three-dimensional molded object manufacturing apparatus 300 is electrically coupled to a control unit 318 that controls various kinds of driving of the ejecting unit 321 and various kinds of driving of the stage unit 322.

Further, the three-dimensional molded object manufacturing apparatus 300 includes a supply-path cooling section 323 for cooling the supply path 303. The supply-path cooling section 323 is a device for cooling the supply path 303 in order to prevent a situation in which heat by the heater 307, the heater 308, the heater 309, and the like heats the supply path 303, the pellets 319 in the supply path 303 melt, and a supply failure of the pellets 319 in the supply path 303 occurs.

As shown in FIG. 5, as in the projector 100 shown in FIG. 1 and the carriage 213 shown in FIG. 2, the cooling unit 101, the liquid feeding pump 105, and the secondary coolant pipe 110 are provided in the supply-path cooling section 323. The secondary coolant pipe 110 is disposed near the supply path 303. The heat exchanging section 107 of the cooling unit 101 is configured to be capable of receiving heat from the supply path 303. That is, the secondary coolant serving as the heat exchange medium and the secondary coolant pipe 110 are provided between the supply path 303 and the heat exchanging section 107. Since the heat exchanging section 107 of the cooling unit 101 is configured to be capable of receiving the heat from the supply path 303, the three-dimensional molded object manufacturing apparatus 300 can be a three-dimensional molded object manufacturing apparatus small in size and having high performance.

Diaphragm Type Compressor

The configuration of the diaphragm type compressor 1 in this embodiment is explained in detail with reference to FIGS. 6 to 12.

Figure 6:
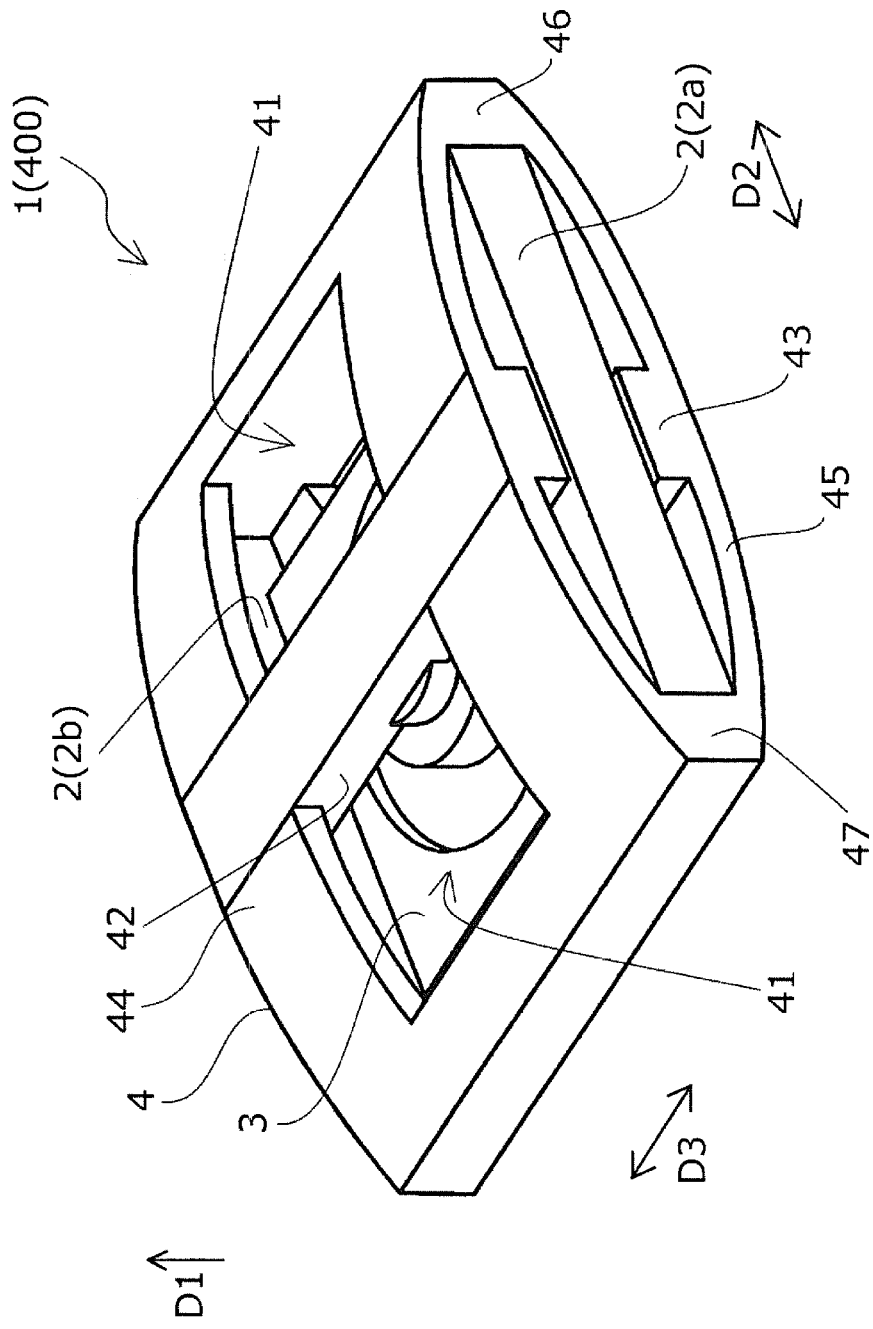
FIG. 6 is a perspective view showing the diaphragm type compressor according to the first embodiment.
Figure 7:
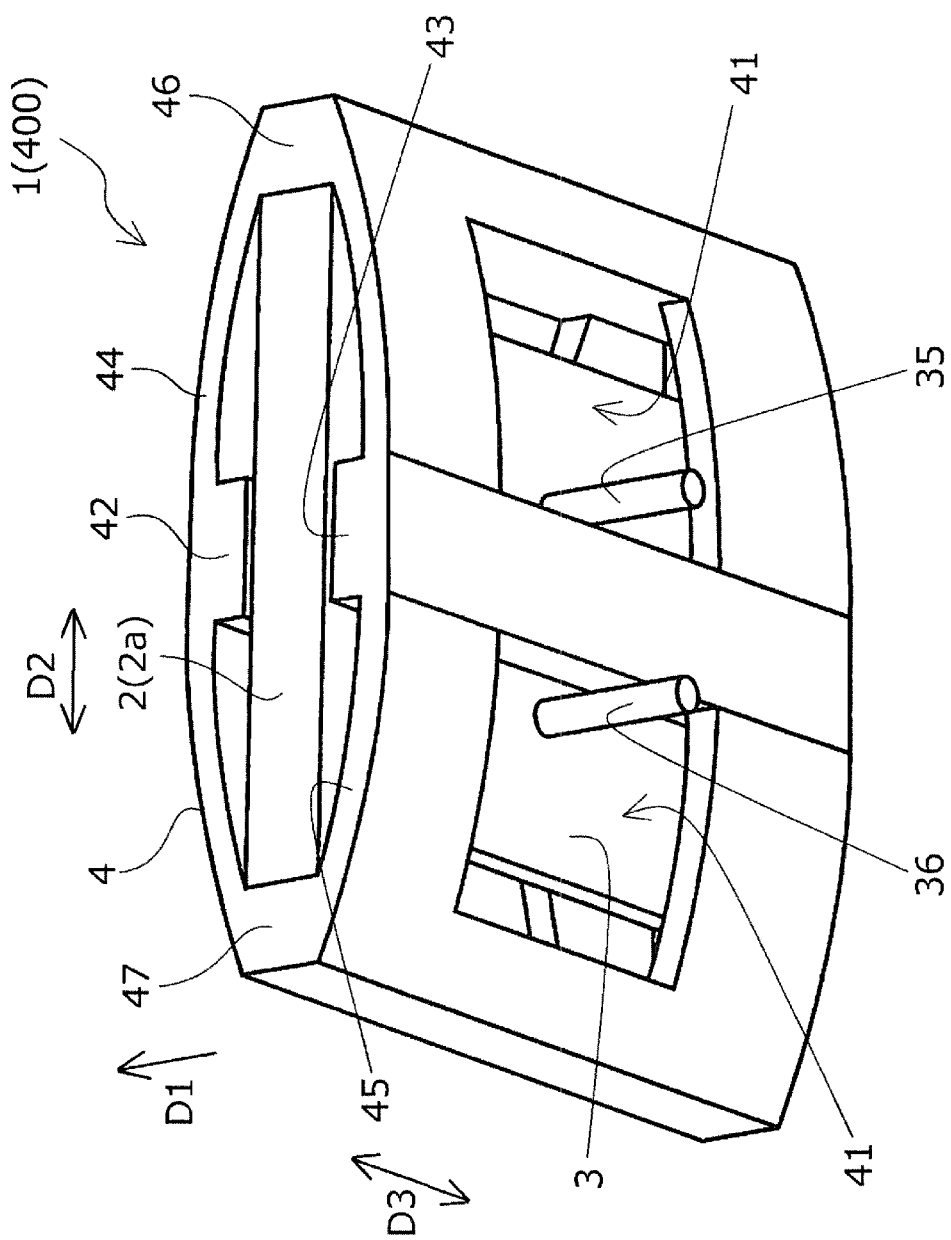
FIG. 7 is a perspective view showing the diaphragm type compressor according to the first embodiment viewed from an angle different from an angle in FIG. 6.
Figure 8:
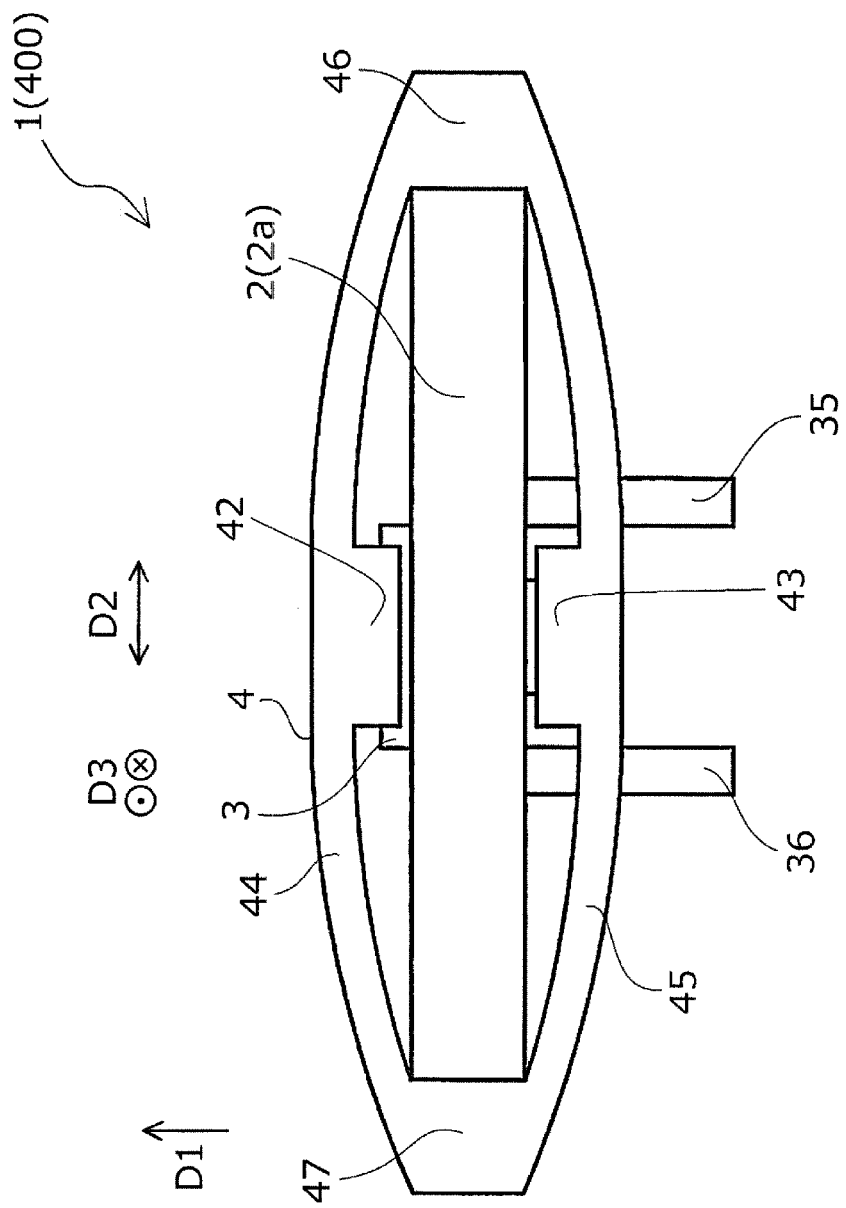
FIG. 8 is a side view showing the diaphragm type compressor according to the first embodiment.

As shown in FIGS. 6 to 8, the diaphragm type compressor 1 in this embodiment includes actuators 2, a diaphragm structure 3, and a first member 4. In detail, the diaphragm type compressor 1 in this embodiment has a configuration in which a first actuator 2a and a second actuator 2b functioning as the actuators 2 are provided on the inside of the flat tubular first member 4, in parts of which hole sections 41 are provided, and the diaphragm structure 3 is provided in a position between the first actuator 2a and the second actuator 2b.

Diaphragm Structure

Figure 9:
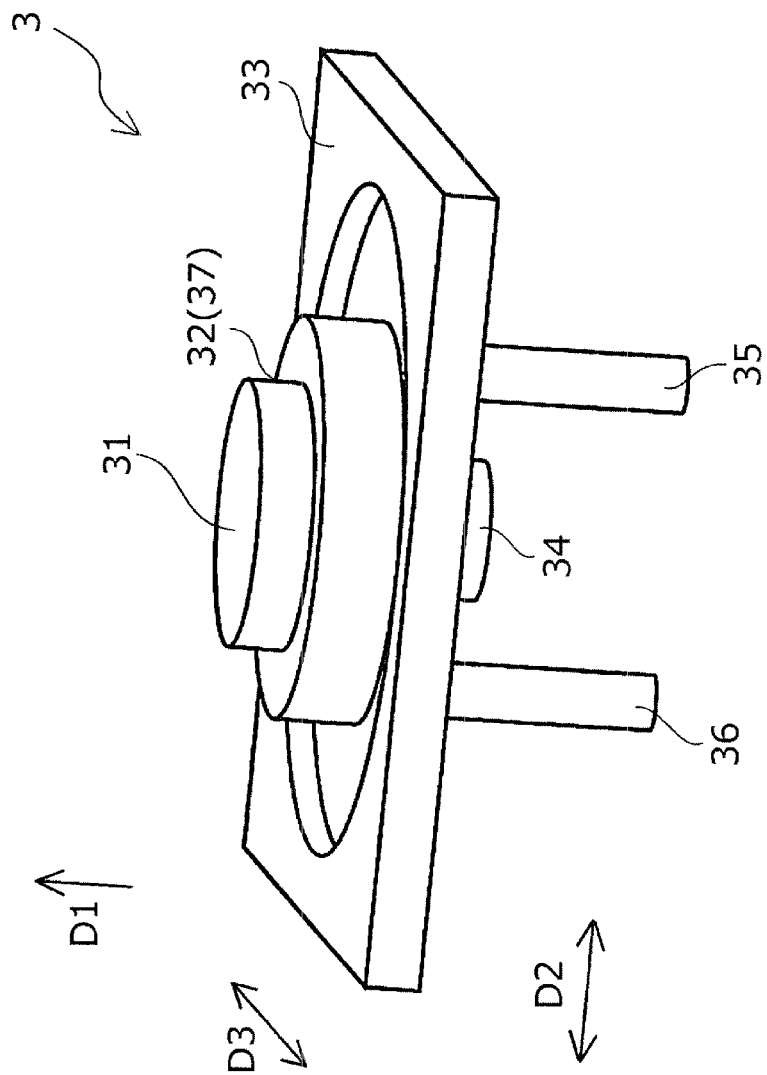
FIG. 9 is a perspective view showing a diaphragm structure of the diaphragm type compressor according to the first embodiment.
Figure 10:
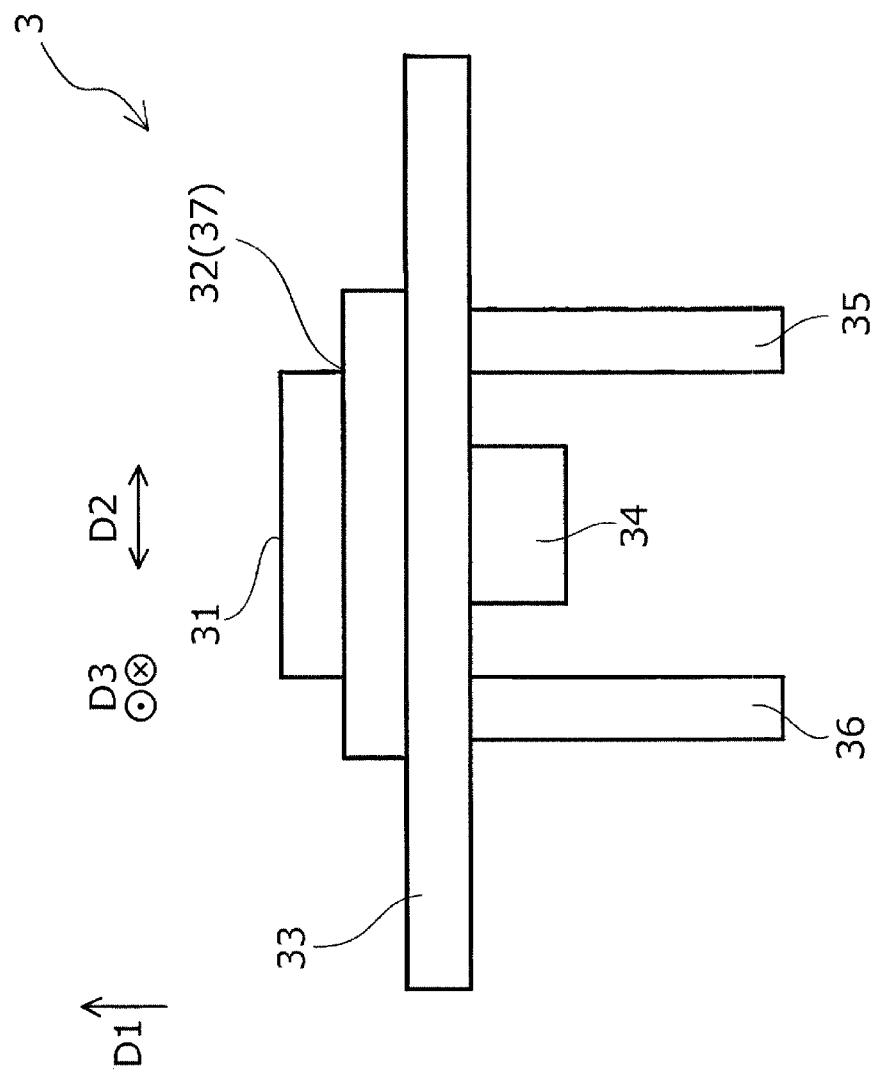
FIG. 10 is a side view showing the diaphragm structure of the diaphragm type compressor according to the first embodiment.

In the diaphragm structure 3, as shown in FIGS. 9 and 10, a diaphragm 31, a two-stage type cylinder member 32 including a compression chamber 37 for the primary coolant on the inside, a substrate 33, and a column member 34 are provided. The diaphragm 31 is considered to be separated from the substrate 33 in a separating direction D1 because the cylinder member 32 is sandwiched between the diaphragm 31 and the base 33. In the cylinder member 32, an inflow path 35 through which fluid flows into the compression chamber 37 and an outflow path 36 through which the primary coolant compressed when the diaphragm 31 is pressed and the compression chamber 37 is compressed flows out are provided. All of the diaphragm 31, the cylinder member 32, and the column member 34 are configured by flexible members.

First Member

Figure 11:
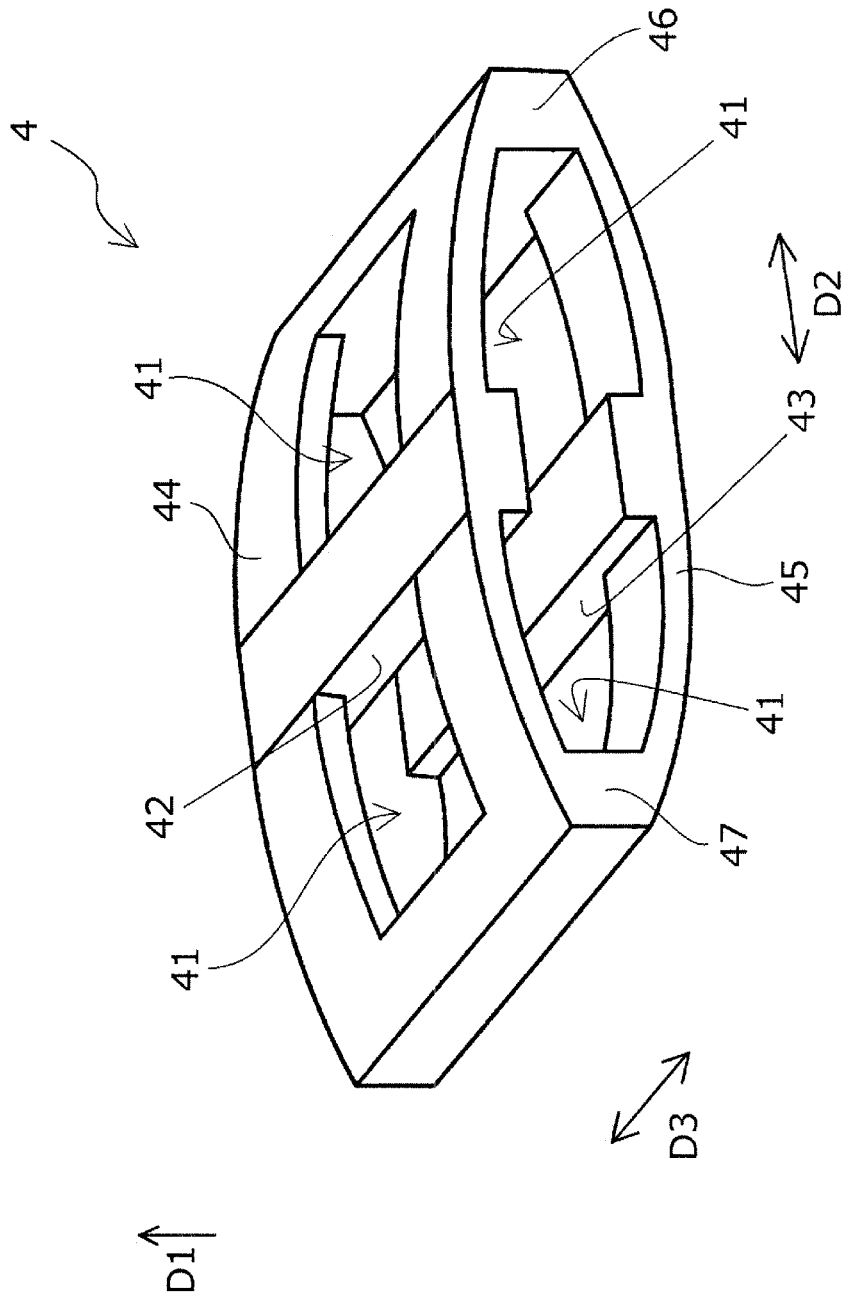
FIG. 11 is a perspective view showing a magnifying unit of the diaphragm type compressor according to the first embodiment.
Figure 12:
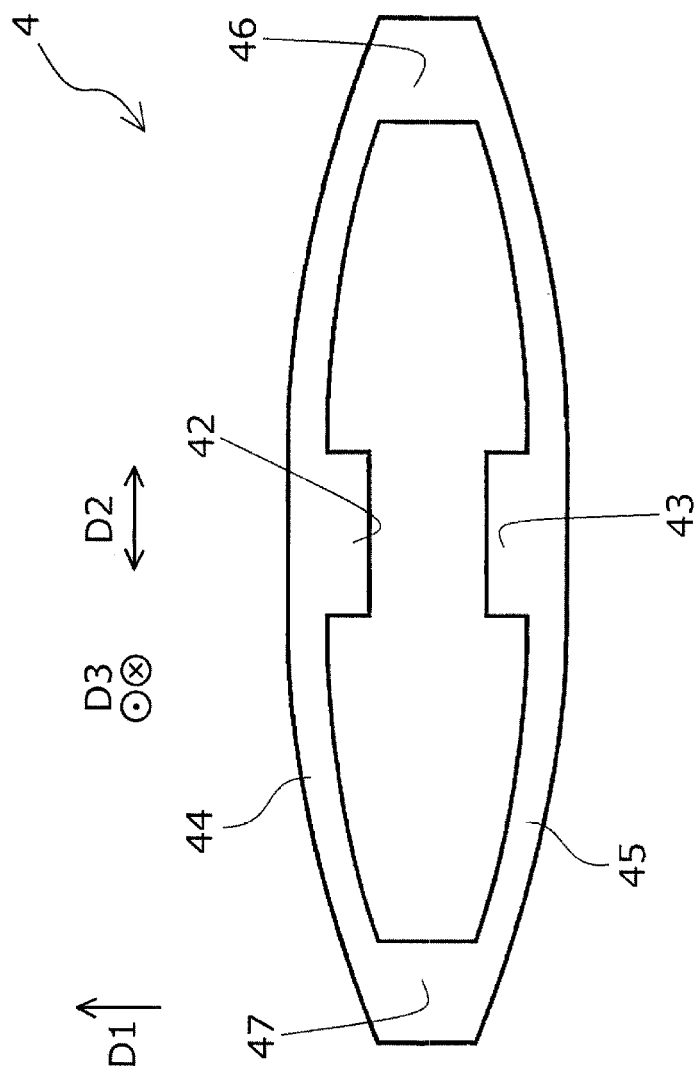
FIG. 12 is a side view showing the magnifying unit of the diaphragm type compressor according to the first embodiment.

As shown in FIGS. 11 and 12, the first member 4 is formed in a flat tubular shape, in four parts of which hole sections 41 are provided. A pressing section 42 that comes into contact with the diaphragm 31 is formed in a first wall section 44. A pressing section 43 that comes into contact with the column member 34 is formed in a second wall section 45 opposed to the first wall section 44. Further, a third wall section 46 and a fourth wall section 47 connecting the first wall section 44 and the second wall section 45 are provided. As shown in FIG. 8 and the like, both of the first actuator 2a and the second actuator 2b are extended from the third wall section 46 to the fourth wall section 47.

Actuator

Both of the first actuator 2a and the second actuator 2b are laminated piezoelectric actuators displaced in a displacing direction D2 by inputting electric signals. When the two actuators 2 configured by the first actuator 2a and the second actuator 2b input the electric signals, the third wall section 46 and the fourth wall section 47 of the first member 4 expand along the displacing direction D2. Therefore, the first member 4 is displaced in a narrowing direction in a direction along the separating direction D1, the diaphragm 31 and the column member 34 are pressed to the inner side in the direction along the separating direction D1, and the compression chamber 37 is compressed.

An apparatus obtained by removing the inflow path 35 and the outflow path 36 from the diaphragm type compressor in this embodiment can be considered a displacement magnifying device 400 in this embodiment.

That is, the displacement magnifying device 400 in this embodiment includes the diaphragm structure 3 including the substrate 33 and the diaphragm 31 provided separately from the substrate 33 in the separating direction D1. The displacement magnifying device 400 includes the actuators 2 displaceable in the displacing direction D2 and provided side by side with the diaphragm structure 3 in a direction D3 crossing the displacing direction D2. The displacement magnifying device 400 includes the first member 4 including the pressing section 42 and the pressing section 43 functioning as displacing sections coupled to both ends of the actuators 2 in the displacing direction D2 and displaced along the separating direction D1 according to displacement of the actuators 2. In the first member 4, the pressing section 42 and the pressing section 43 are coupled to the diaphragm structure 3 in a direction along the separating direction D1.

In this way, the displacement magnifying device 400 in this embodiment includes the first member 4 in which the pressing section 42 and the pressing section 43 coupled to both the ends of the actuators 2 in the displacing direction D2 and displaced in the separating direction D1 according to displacement of the actuators 2 are coupled to the diaphragm structure 3 in the direction along the separating direction D1. Therefore, it is possible to set the displacement of the pressing section 42 and the pressing section 43 involved in the displacement of the actuators 2 large and greatly displace the diaphragm 31. The displacement magnifying device 400 in this embodiment is reduced in size because the actuators 2 are provided in parallel to the diaphragm structure 3 in the displacing direction D2.

The displacing direction D2 is a direction crossing the separating direction D1. In detail, the displacing direction D2 is a direction orthogonal to the separating direction D1. Since the displacing direction D2 is set in the direction crossing the separating direction D1, the displacing direction of the diaphragm 31 and the displacing direction of the actuators 2 are directions crossing each other. Therefore, by adopting such a configuration, it is possible to execute mechanical resonance of the actuators 2 and the first member 4 that alternately perform the displacement of the actuators 2 and the displacement of the first member 4. It is possible to set the displacement amount of the diaphragm 31 particularly large.

As explained above, the first member 4 includes the pressing section 42 and the pressing section 43 as the displacing sections. In other words, the first member 4 includes the pressing section 42 functioning as the first displacing section and the pressing section 43 functioning as the second displacing section. As shown in FIG. 8, the pressing section 42 and the pressing section 43 are coupled to the diaphragm structure 3 to sandwich the diaphragm structure 3 in the direction along the separating direction D1. Since the displacement magnifying device 400 in this embodiment has such a configuration, it is possible to set the displacement amount of the diaphragm 31 particularly large.

As explained above, in the displacement magnifying device 400 in this embodiment, a plurality of actuators 2 displaced in the displacing direction D2 are provided and the diaphragm structure 3 is provided between the plurality of actuators 2. Since the displacement magnifying device 400 in this embodiment has such a configuration, it is possible to set the displacement amount of the diaphragm 31 particularly large.

As explained above, the diaphragm type compressor in this embodiment can be expressed as including the displacement magnifying device 400, the inflow path 35 formed between the substrate 33 and the diaphragm 31 and coupled to the compression chamber 37, the primary coolant, which is fluid, flowing in through the inflow path 35, and the outflow path 36 coupled to the compression chamber 37, the primary coolant compressed by displacement of the pressing section 42 and the pressing section 43 involved in the displacement of the actuators 2 flowing out from the compression chamber 37 through the outflow path 36. Since the diaphragm type compressor 1 in this embodiment includes the displacement magnifying device 400 small in size and having a large displacement amount as explained above, the diaphragm type compressor 1 is a diaphragm type compressor small in size and having high performance.

Figure 13:
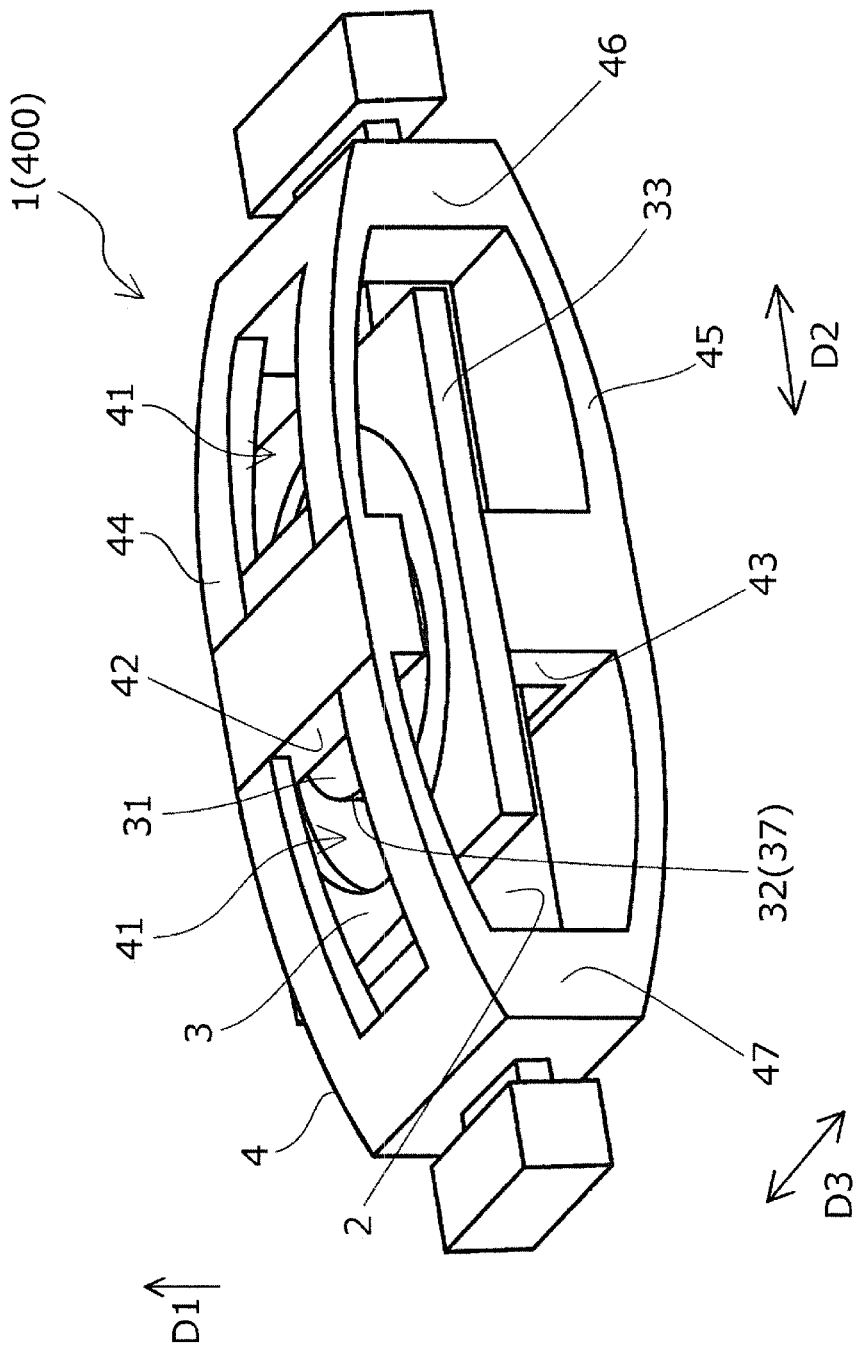
FIG. 13 is a perspective view showing a diaphragm type compressor according to a second embodiment of the present disclosure.
Figure 14:
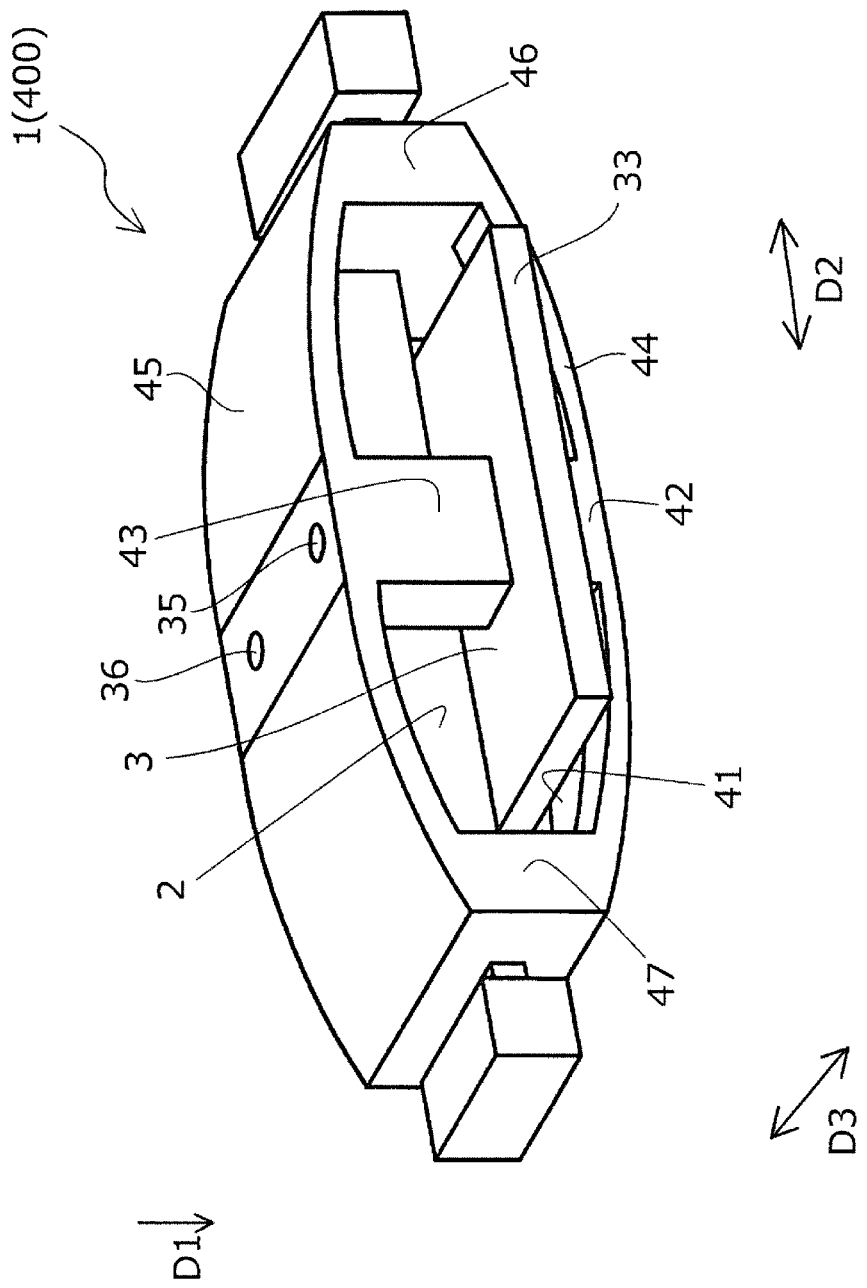
FIG. 14 is a perspective view showing the diaphragm type compressor according to the second embodiment viewed from an angle different from an angle in FIG. 13.
Figure 15:
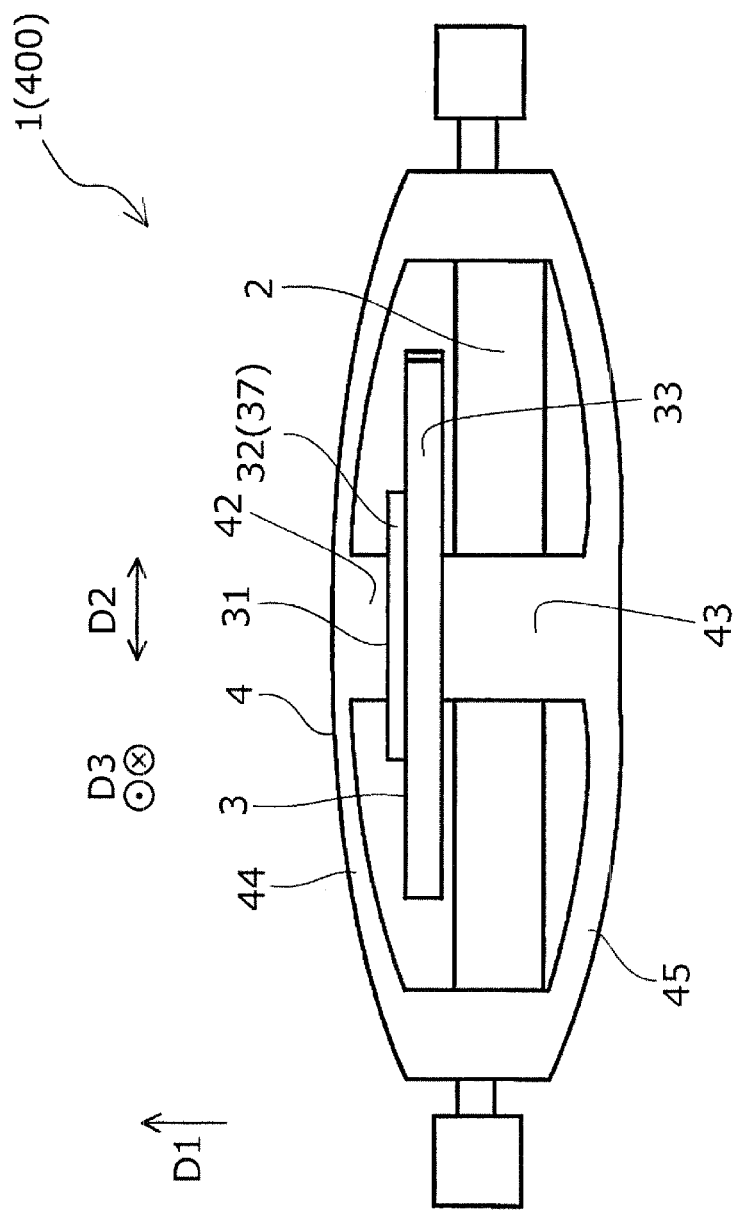
FIG. 15 is a side view showing the diaphragm type compressor according to the second embodiment.

Second Embodiment (FIGS. 13 to 15)

The diaphragm type compressor 1 according to a second embodiment of the present disclosure is explained with reference to FIGS. 13 to 15. Constituent members common to the first embodiment are denoted by the same reference numerals and signs. Detailed explanation of the constituent members is omitted.

As shown in FIGS. 13 to 15, compared with the diaphragm type compressor 1 in the first embodiment, the diaphragm type compressor 1 in this embodiment includes the diaphragm structure 3 not including the column member 34 and including the cylinder member 32 of a one-stage type instead of the cylinder member of the two-stage type and one actuator 2 instead of the plurality of actuators 2. In this way, in the present disclosure, the number of the actuators 2 is not particularly limited. The hole sections 41 are not provided in the second wall section 45. The inflow path 35 and the outflow path 36 are provided side by side in the direction D3 crossing the displacing direction D2 instead of being provided side by side in the displacing direction D2. In this way, in the present disclosure, the shape of the first member 4 is not particularly limited.

Figure 16:
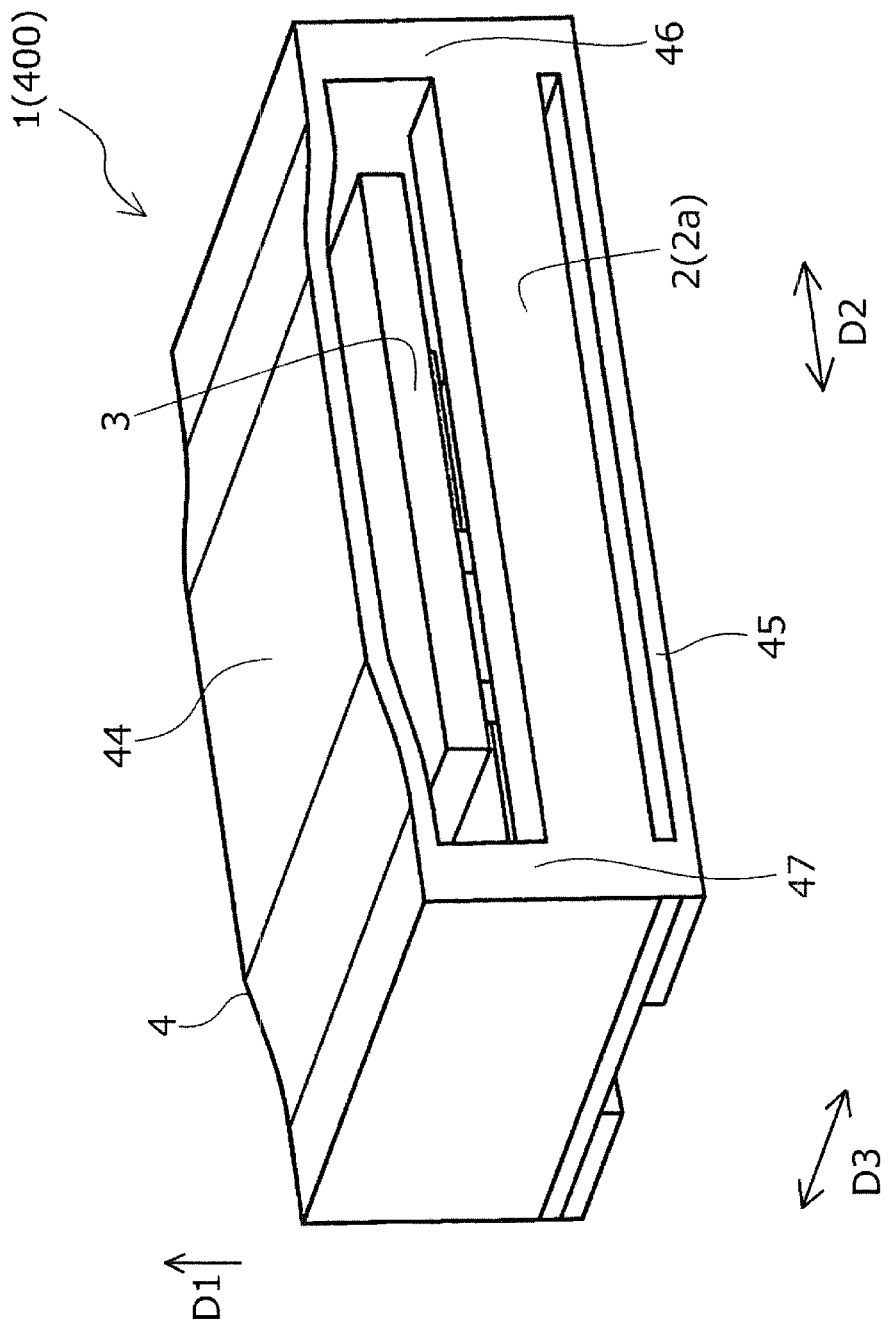
FIG. 16 is a perspective view showing a diaphragm type compressor according to a third embodiment of the present disclosure.
Figure 17:
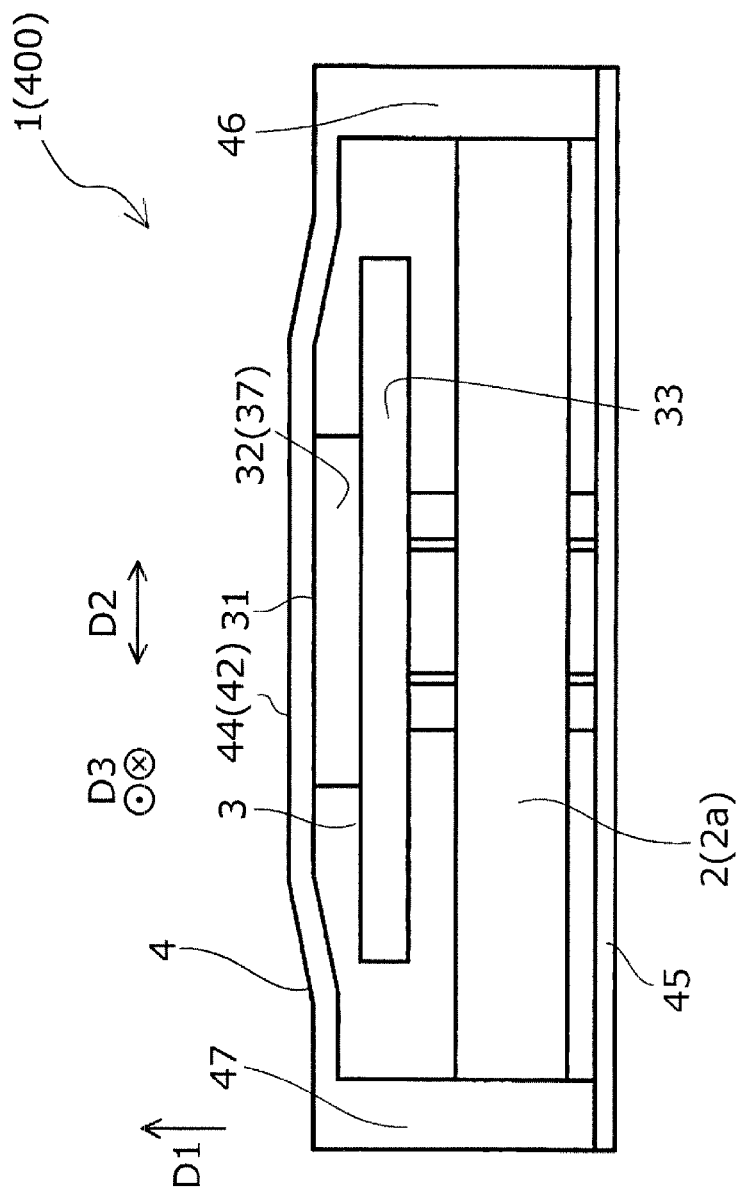
FIG. 17 is a side view showing the diaphragm type compressor according to the third embodiment.

Third Embodiment (FIGS. 16 and 17)

The diaphragm type compressor 1 according to a third embodiment of the present disclosure is explained with reference to FIGS. 16 and 17. Constituent members common to the first and second embodiments are denoted by the same reference numerals and signs. Detailed explanation of the constituent members is omitted.

As shown in FIGS. 16 and 17, the diaphragm type compressor 1 in this embodiment includes the diaphragm structure 3 including the cylinder member 32 of the one-stage type. The diaphragm type compressor 1 in the first and second embodiments includes the pressing section 42 on the first wall section 44 side and the pressing section 43 on the second wall section 45 side as the displacing sections. However, the first wall section 44 functioning as the displacing section as well is only provided in the diaphragm type compressor 1 in this embodiment. That is, a pressing force is not applied to the diaphragm structure 3 from the second wall section 45 side. In this way, the present disclosure is not limited to the configuration in which the two displacing sections provided to be opposed to each other sandwich the diaphragm structure 3 in the direction along the separating direction D1. In other words, the number of displacing sections is not particularly limited either.

The present disclosure is not limited to the embodiments. Various modifications are possible within the scope of the invention described in the appended claims. It goes without saying that the modifications are included in the scope of the invention as well. For example, the diaphragm type compressor 1 of the present disclosure can be applied to various apparatuses such as a robot other than the projector 100, the recording apparatus 200, and the three-dimensional molded object manufacturing apparatus 300.

What is claimed is:

1. A displacement magnifying device comprising:
   a diaphragm structure including a substrate and a diaphragm provided separately from the substrate;
   an actuator provided side by side with the diaphragm structure; and
   a first member including a displacing section coupled to both ends of the actuator and displaced according to displacement of the actuator, wherein
   the displacing section is coupled to the diaphragm of the diaphragm structure.

2. The displacement magnifying device according to claim 1, wherein a displacing direction of the actuator crosses a displacing direction of the diaphragm.

3. The displacement magnifying device according to claim 1, wherein
   the first member includes a first displacing section and a second displacing section as the displacing section, and
   in a displacing direction of the diaphragm, the first displacing section and the second displacing section sandwich and couple the diaphragm structure.

4. The displacement magnifying device according to claim 1, wherein
   a plurality of the actuators are provided, and
   the diaphragm structure is provided between the plurality of actuators.

5. A diaphragm type compressor comprising:
   the displacement magnifying device according to claim 1;
   an inflow path formed in the substrate and coupled to a compression chamber formed between the substrate and the diaphragm, fluid flowing in through the inflow path; and
   an outflow path coupled to the compression chamber, the fluid compressed by displacement of the displacing section involved in the displacement of the actuator flowing out from the compression chamber through the outflow path.

6. A cooling unit comprising:
   the diaphragm type compressor according to claim 5;
   a heat radiating section for the fluid;
   a heat exchanging section for the fluid; and
   an expanding section for the fluid.

7. A projector comprising:
   a light source;
   a panel configured to absorb light;
   a heat exchange medium; and
   the cooling unit according to claim 6, wherein
   the heat exchange medium is provided between at least one of the light source and the panel and the heat exchanging section.

8. A recording apparatus comprising:
   a recording head configured to eject ink;
   an electronic circuit board coupled to the recording head;
   a heat exchange medium; and
   the cooling unit according to claim 6, wherein
   the heat exchange medium is provided between at least one of the recording head and the electronic circuit board and the heat exchanging section.

9. A three-dimensional molded object manufacturing apparatus comprising:
   a hopper configured to store a material serving as a constituent material of a three-dimensional molded object;
   a melting section configured to melt the material;
   a supply path for supplying the material from the hopper to the melting section;
   a heat exchange medium;
   the cooling unit according to claim 6, wherein
   the heat exchange medium is provided between the supply path and the heat exchanging section.

* * * * *